(12) United States Patent
Yajima et al.

(10) Patent No.: US 6,499,602 B2
(45) Date of Patent: Dec. 31, 2002

(54) SUPPORT DEVICE FOR A WAFER SHIPPING CONTAINER

(75) Inventors: Toshitsugu Yajima, Itoigawa (JP); Hiroyuki Funami, Niigata (JP)

(73) Assignee: Shin-Etsu Polymer Co., Ltd., Tokyo (JP)

(*) Notice: Subject to any disclaimer, the term of this patent is extended or adjusted under 35 U.S.C. 154(b) by 13 days.

(21) Appl. No.: 09/819,836

(22) Filed: Mar. 28, 2001

(65) Prior Publication Data

US 2001/0042697 A1 Nov. 22, 2001

(30) Foreign Application Priority Data

Apr. 17, 2000 (JP) ........................................ 2000-115644

(51) Int. Cl.[7] .............................................. B65D 85/00
(52) U.S. Cl. ...................... 206/711; 206/454; 211/41.18
(58) Field of Search ............................... 206/454, 710, 206/711, 832; 211/41.18

(56) References Cited

U.S. PATENT DOCUMENTS

| 4,718,552 A | * | 1/1988 | Rossi et al. | ............... | 206/308.3 |
| 4,787,508 A |   | 11/1988 | Wu et al. | | |
| 5,782,362 A | * | 7/1998 | Ohori | ......................... | 206/454 |
| 6,041,938 A | * | 3/2000 | Senn | ......................... | 118/500 |

FOREIGN PATENT DOCUMENTS

| JP | 06-069328 | 3/1994 |
| JP | 09-129719 | 5/1997 |
| JP | 09-246369 | 9/1997 |
| JP | 10-064991 | 3/1998 |
| JP | 2000-091400 | 3/2000 |
| JP | 2000-332097 | 11/2000 |

* cited by examiner

Primary Examiner—David T. Fidei
(74) Attorney, Agent, or Firm—Darby & Darby (57) ABSTRACT

A support device for a wafer shipping container, to constrain the flexure of a multiple number of backgrind-processed wafers when the wafers are stored in alignment in the wafer shipping container. For this support device, stoppers are projected inwards from the front and rear sides of a container body as a part of the wafer shipping container. The support device is comprised of: a pair of opposing walls, which are positioned on the bottom side of the container body and inserted into, and fixed by, the stoppers; a pair of connecting bars across the spacing between the paired opposing walls; a multiple number of partitioning supporters arranged with a predetermined pitch in the longitudinal direction of the paired connecting bars. The wafers are inserted and held between adjoining partitioning supporters, whereby they are prevented from flexing.

6 Claims, 7 Drawing Sheets

SUPPORT DEVICE FOR A WAFER SHIPPING CONTAINER

BACKGROUND OF THE INVENTION (1) Field of the Invention

The present invention relates to a support device for a wafer shipping container for shipping silicon wafers and the like used in production of semiconductor products. More detailedly the present invention relates to a support device for a wafer shipping container suitable for keeping and transporting wafers which have been precision shaped and processed to an extra fine thickness with electronic circuitry interconnections patterned on the obverse side thereof and their reverse side ground by the backgrind process.

(2) Description of the Prior Art

A conventional wafer shipping container is comprised of a container body of a cylinder with a bottom, a cassette 6 set in this container body for holding multiple wafers in alignment with a pitch of a predetermined distance by holding slots 9, and a lid element being fitted on the open side of the container body with a gasket in between and a wafer presser optionally attached on the interior side of this lid element. Wafers W of a polished type with diameters of 6" (about 150 mm) and 8" (about 200 mm) are currently mass produced. The currently predominant wafers W are 625 $\mu$m 725 $\mu$m in thickness.

Figure 1:
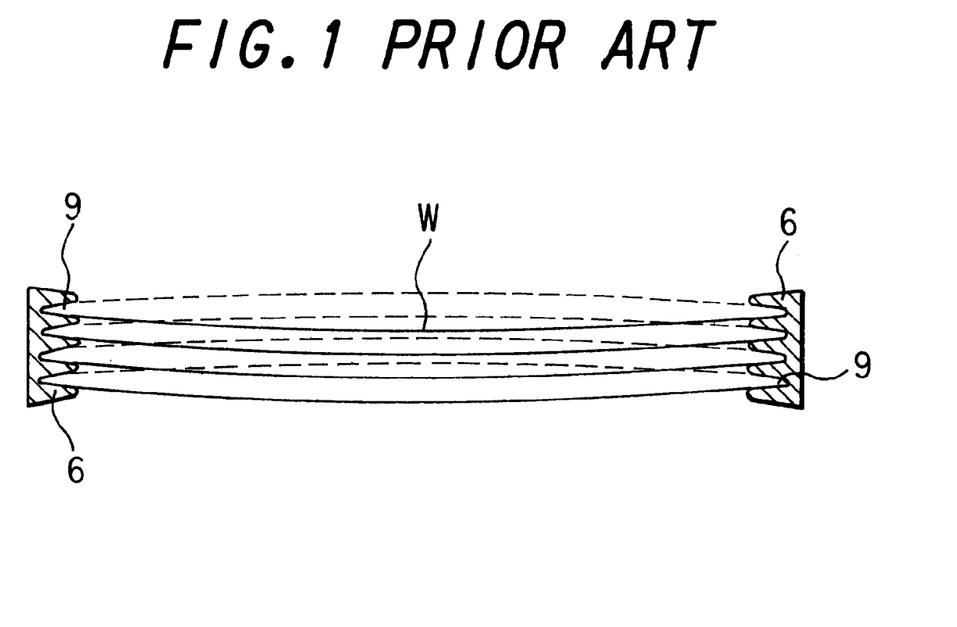
FIG. 1 is a partial sectional view showing a state where backgrind-processed wafers kept in alignment in the cassette of a conventional wafer shipping container are being flexed.

Wafer W having undergone various processes and shaping is patterned on its surface with electronic circuitry, then is transferred to the backgrind stage where its underside(rear side) is ground in conformity with the thickness specifications of the final product so as to form a backgrind wafer with its thickness precisely controlled to an extra thin level (50 $\mu$m to 304 $\mu$m). Such wafers W are very costly since electronic circuitry has been patterned on the obverse side but they are still easy to bend and break mechanically so that they should be handled very carefully (in respect to this, see FIG. 1).

Since the conventional wafer shipping container simply holds a multiple number of wafers W with holding slots 9 in cassette 6, wafers W are liable to rattle resulting from the combination of dimensional deviations of the wafer thickness and that of holding slots 9 of cassette 6 when backgrind-processed wafers W are stored in the container and shipped to another site for a next step such as a dicing process etc., and hence the wafers will relatively easily resonate due to vibrations during shipment. Further, since the conventional wafer shipping container has no member which fixes up the central part of wafers W which have been backgrind-processed, the amplitude of the vibrations becomes greater so that there is a high risk that wafers W may flex and interfere with each other or wafers W may vibrate beyond their strength limit, resulting in them being damaged or broken.

Still more, if even one of multiple large-diametric wafers W or one of multiple wafers with electronic circuitry formed thereon becomes broken during transportation, the broken pieces etc. can cause bad influence or secondary damage to the electronic circuitry of the other wafers W. In such an event, all the wafers W will become unusable for the most cases, resulting in a markedly high monetary loss.

In view of these problems, Japanese Patent Application Laid-Open Hei 9 No. 129719 and Japanese Patent Application Laid-Open Hei 9-246369 disclose a method whereby a cylinder portion of an approximate cylindrical shape is fixed upright in the container body of a wafer shipping container so as to keep a multiple number of wafers W horizontally in layers with cushioning elements interposed therebetween. However, this method needs dedicated equipment, hence posing a troublesome problem that the existing installation cannot be used any longer.

SUMMARY OF THE INVENTION

The present invention has been devised in view of the above problems, it is therefore an object of the present invention to provide a support device for a wafer shipping container, which can be used in existing equipment as is without the necessity of significant change, effectively remove the risks of the wafers relatively easily resonating due to vibrations and being damaged and broken and prevent the broken pieces of one wafer from adversely affecting the other wafers or causing secondary damage.

The present invention has been achieved in order to attain the above object, and the present invention is configured as follows:

In accordance with the first aspect of the present invention, a support device for a wafer shipping container, for constraining the flexure of a multiple number of backgrind-processed wafers when the wafers are stored in alignment in the wafer shipping container, is characterized in that stoppers for the support device are formed on the inner sides of the wafer shipping container, the support device is comprised of: a pair of opposing walls, which are positioned against the abutment side opposite to the open side of the wafer shipping container and fixed by the stoppers; a pair of connecting bars across the spacing between the paired opposing walls; a multiple number of partitioning supporters arranged with a predetermined pitch in the longitudinal direction of the connecting bars, and the wafers are inserted and held between adjoining partitioning supporters.

In accordance with the second aspect of the present invention, the support device for a wafer shipping container, having the above first feature is characterized in that the partitioning supporters are projected equal to or greater than one third of the wafer diameter to receive and hold the wafer between adjoining partitioning supporters.

In accordance with the third aspect of the present invention, the support device for a wafer shipping container, having the above first feature is characterized in that guide portions are formed at the distal part on the open side in the paired opposing walls of the support device.

In accordance with the fourth aspect of the present invention, the support device for a wafer shipping container, having the above first feature is characterized in that the multiple partitioning supporters of the support device are configured so that the spacing between adjoining partitioning supporters becomes gradually greater as it goes upwards, forming a wafer introductory guide, which serves as a guide when the wafer is fitted in.

In accordance with the fifth aspect of the present invention, the support device for a wafer shipping container, having the above first feature is characterized in that the multiple partitioning supporters are provided to span the spacing between, and perpendicularly to, the paired connecting bars at regular intervals.

In accordance with the sixth aspect of the present invention, the support device for a wafer shipping container, having the above first feature is characterized in that each of the partitioning supporters is formed of a plate-like element.

In accordance with the seventh aspect of the present invention, the support device for a wafer shipping container having the above first feature is characterized in that each of the partitioning supporters is formed of a pair of projecting bars inclined upwards with their top ends close to each other.

The wafer shipping container of the present invention may be of a top opening box type or a front opening box type. For keeping multiple wafers in alignment in this wafer shipping container, a multiple number of wafers may be put in alignment in a cassette then this cassette may be in turn placed into the container body. Alternatively, multiple holding slots may be integrally formed on both the interior side walls of the container body so that multiple wafers can be set in alignment using these holding slots without using any cassette. The material and diameter of the wafers to be handled, such as silicon wafers of, 3", 6", 8"and 12", may be changed as appropriate. The wafers may be of any number but being at least two, 13, 25, 26 and so on. The abutment side of a wafer shipping container means the bottom (underside) if the wafer shipping container is a top open box type and the posterior side if the wafer shipping container is a front open box type.

Further, according to the present invention, by placing a multiple number of backgrind-processed wafers in alignment in the wafer shipping container, these wafers can be held between the partitioning supporters of the support device so that flexure of the wafers can be constrained by the partitioning supporters.

DESCRIPTION OF THE PREFERRED EMBODIMENTS

The preferred embodiment of the present invention will hereinafter be described in detail with reference to the accompanying drawings. As shown in FIGS. 2 through 8, a multiple number of backgrind-processed wafers W are stored in alignment in a wafer shipping container 1 while a support device 16 for the wafer shipping container in this embodiment regulates these wafers W so as not to be deformed.

Figure 2:
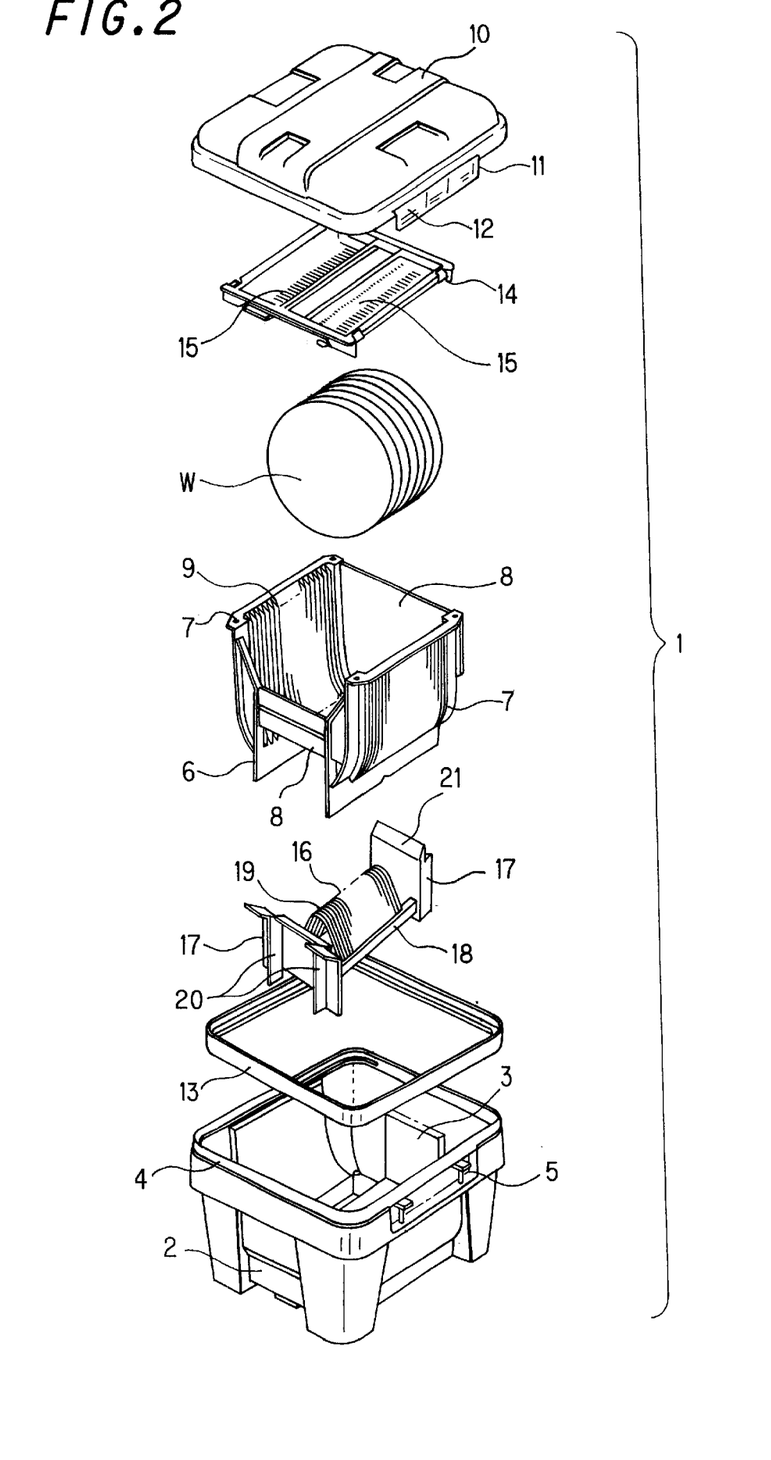
FIG. 2 is a perspective exploded view showing the embodiment of a support device of a wafer shipping container according to the present invention.

Similarly to the conventional configuration, wafer shipping container 1 is comprised, as shown in FIG. 2, of a box-shaped container body 2 with its top open, a cassette 6 which is made up of polypropylene and detachably placed in this container body 2 to keep a multiple number of wafers W in alignment, a removable lid element 10 covered on the open side of container body 2 with a gasket 13 interposed therebetween, a wafer presser 14 optionally attached on the interior side of lid element 10 so as to protect the multiple wafers W from vibrations and impacts. Container body 2 is formed translucently with stoppers 3 projected inwards at least from the front and rear sides by injection molding using, for example, polypropylene or other material which presents an excellent chemical resistance. The brim of container body 2 around the opening is molded with thin walls to form a fitting depression 4 for receiving gasket 13. A plurality of hooks 5 are projected from the upper part of the outer side walls of container body 2.

As seen in the same figure, cassette 6 has a pair of side walls 7 spaced on the left and right, opposing each other. A pair of end walls 8 are placed at the front and rear sides and attached to this pair of side walls 7. The inner side of each side wall 7 is formed with a number of holding slots 9 extending vertically and arranged in parallel to each other in the front to rear direction. These multiple supporting slots 9 position multiple wafers W in parallel to each other with a predetermined pitch storing them in alignment. Lid element 10 is injection molded of polycarbonate or the like, which is excellent in impact resistance, heat resistance and the like, to be transparent so as to allow the wafers W to be observed. Lid element 10 has a pair of plate-like engagement pieces 11 pivotally projected at the lower part of the side walls thereof. Each engagement piece 11 has a plurality of holes 12 to be mated with hooks 5 so as to confine the open side of container body 2.

As shown in the same drawing, gasket 13 is molded in a frame-like form using a polyester elastomer or other thermoplastic elastomers, silicone rubber, fluororubber or other synthetic rubbers, or the like. This gasket 13 is fitted as a packing to fitting depression 4 of container body 2 when lid element 10 is set so as to seal the container and ensure airtightness. Wafer presser 14 is injection molded in a roughly frame-like form using a polyester elastomer or other thermoplastic elastomers excellent in impact resistance, or a polypropylene or synthetic resins and removably attached to the inner side of lid element 10. Resilient support pieces 15 having an approximately L-shaped section are arranged in the front-to-rear direction on both the side walls of wafer presser 14. A V-groove is formed at the distal part of each support piece 15 to guide the upper rim of wafer W and fit and press it. That is, these V-grooves constrain the movement of wafers W in holding slots 9.

Figure 3:
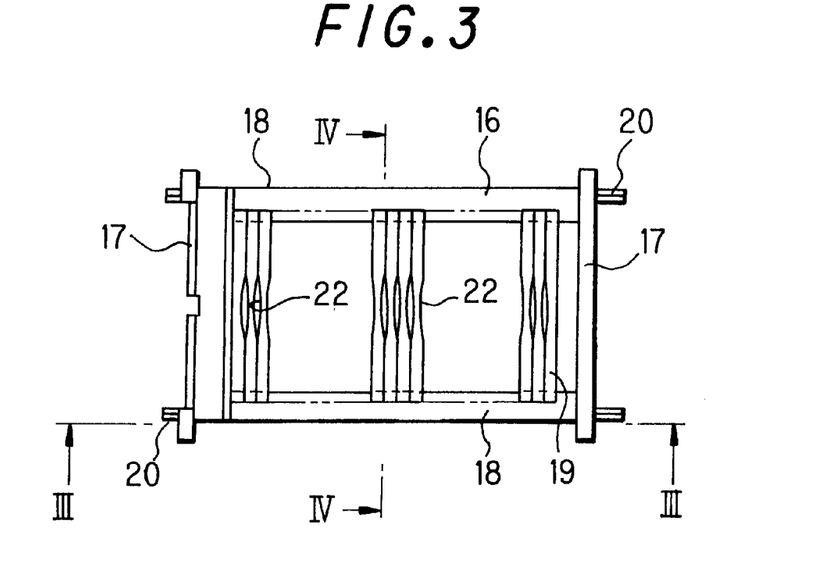
FIG. 3 is a plan view showing a support device in the embodiment of a support device for a wafer shipping container according to the present invention.
Figure 4:
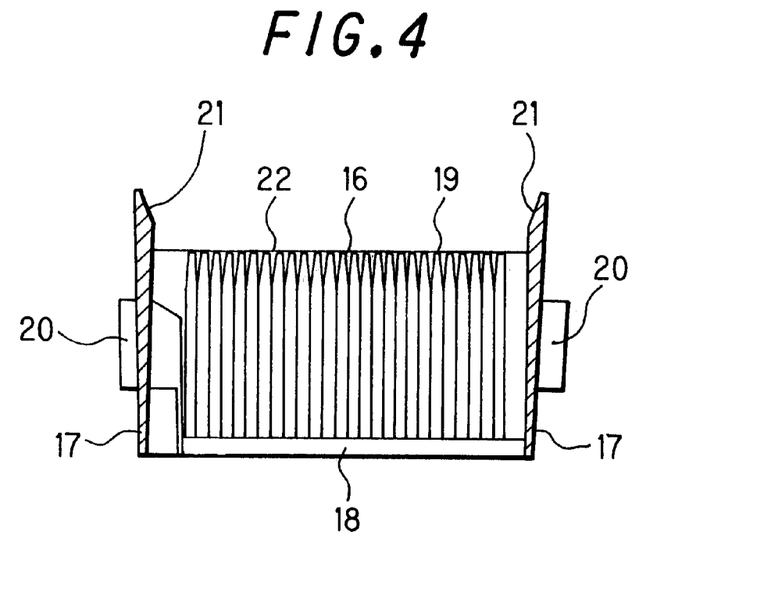
FIG. 4 is a sectional view taken along a plane III—III in FIG. 3.
Figure 5:
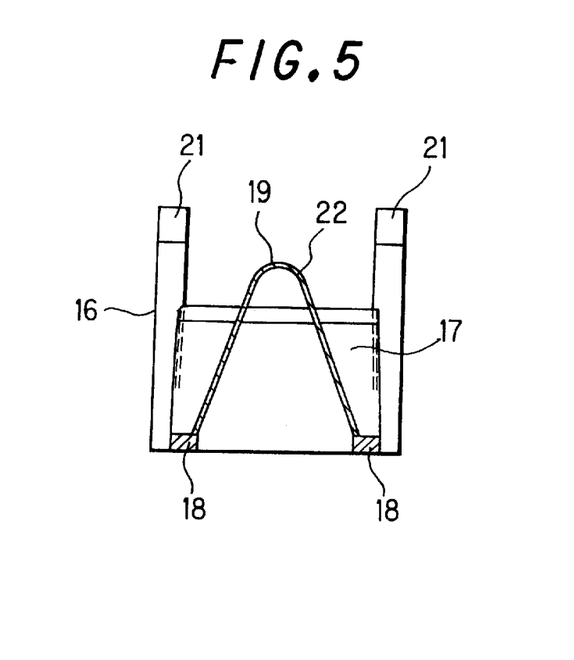
FIG. 5 is a sectional view taken along a plane IV—IV in FIG. 3.

Support device 16 is molded using a thermoplastic resin such as polypropylene, polyethylene, polycarbonate, polybutylene terephthalate and the like or a thermoplastic elastomer resin such as polyolefines elastomers and polyester elastomers. Molding of wafer shipping container is performed preferably using polypropylene or polyester elastomers, which have been presently and generally used as the material for wafer shipping container 1 and are excellent in flexibility and moldability. This support device 16, as shown in FIGS. 3 through 5, is comprised of a pair of opposing walls 17 which are located on the bottom side opposite to the open side of container body 2 and can be detachably fitted to corresponding stoppers 3, a pair of connecting bars 18 integrally connected across the space between the side parts of paired opposing walls 17, a number of partitioning supporters 19 integrally arranged on these paired connecting bars 18 with a predetermined pitch with respect to the longitudinal direction (the left and right direction in FIG. 3) to hold inserted wafers W.

Figure 6:
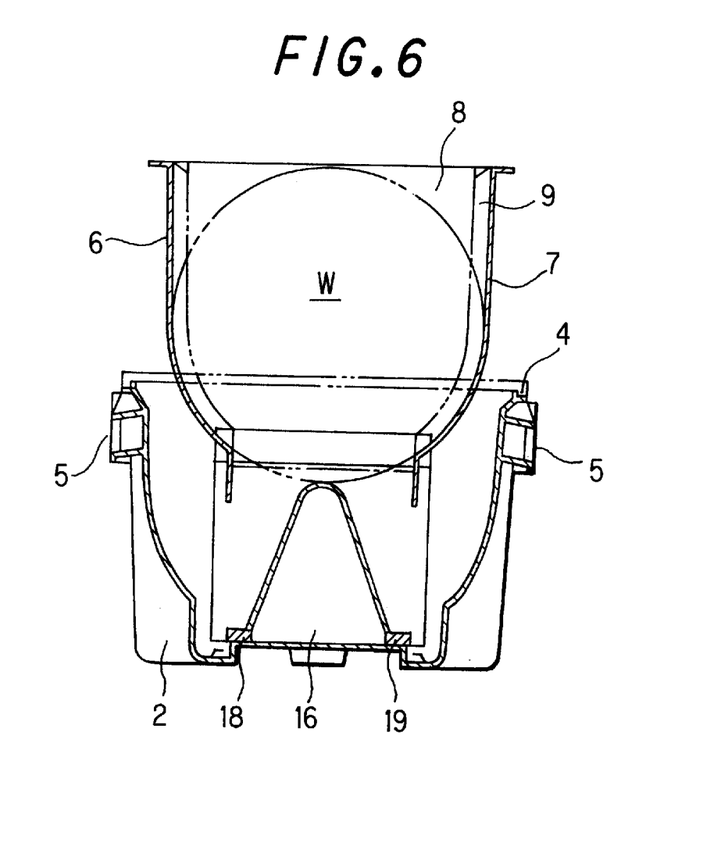
FIG. 6 is an illustrative sectional view showing a state where the cassette is about to be set in the embodiment of a support device for a wafer shipping container according to the present invention.
Figure 7:
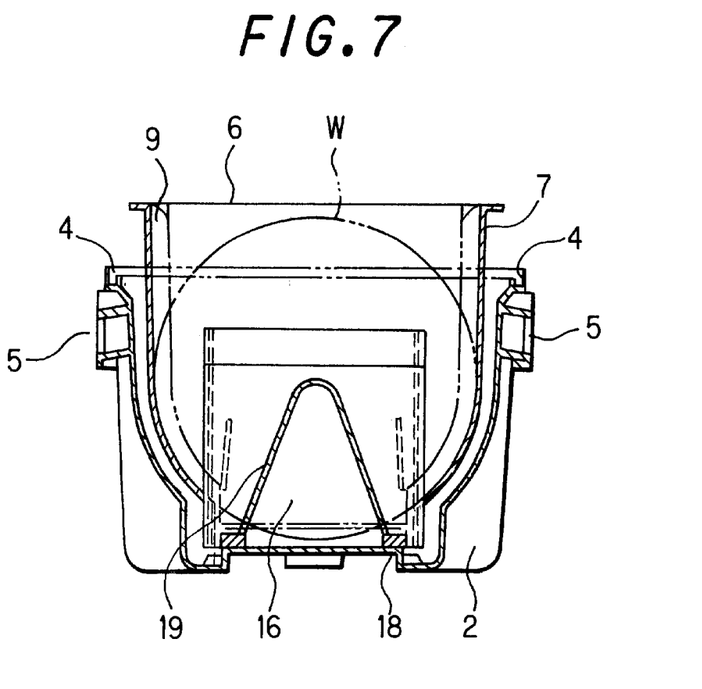
FIG. 7 is an illustrative sectional view showing a state where the cassette is set in place in the embodiment of a support device for a wafer shipping container according to the present invention.

Each opposing wall 17 has a pair of fitting ribs 20 projected from the outer side thereof. These paired fitting ribs 20 are removably fitted to corresponding stopper 3 of container body 2 so as to be positioned and fixed. The upper part of each opposing wall 17 is formed with a guide portion 21 which is bent and gradually inclined outward as it goes upwards. This guide portion 21 comes in contact with the bottom of cassette 6 and functions to position and guide cassette 6 (see FIGS. 6 and 7). For the multiple partitioning supporters 19, adjoining partitioning supporters 19 and 19 are arranged with the same interval or pitch as that of holding slots 9. The width of the spacing to which wafer W is inserted between adjacent partitioning supporters 19 is set greater by about 0.8 mm to 1.2 mm than the thickness of the wafer W. As shown in FIG. 7, partitioning supporters 19 are formed as high as one fourth to three fourth of the diameter of wafer W, preferably as high as one third to one half of the diameter of wafer W, to receive and hold the wafer between adjoining partitioning supporters 19 and 19.

Figure 8:
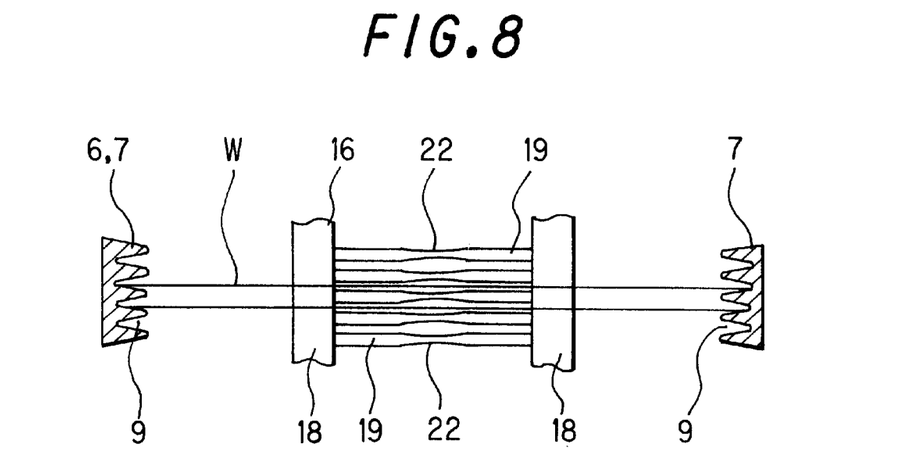
FIG. 8 is a partial plan view showing a support device in the embodiment of a support device for a wafer shipping container according to the present invention.

Each partitioning supporter 19 is formed to be curved at the top in an approximately inverted U-shape, in an approximately inverted V-shape or in an arch-shape, as shown in FIGS. 2, 5, 6 and 7. The front and rear faces in the upper part of each partitioning supporter 19 are formed to be inclined so that the spacing between adjoining partitioning supporters becomes gradually greater as it goes upwards, forming an introductory guide 22, as shown in FIGS. 3 and 8, which serves as a guide when wafer W is fitted in. The spacing between guide surfaces of this introductory guide 22 is formed greater by 1.5 mm to 3 mm than the thickness of wafer W to be fitted therein.

In the above configuration, when a multiple number of backgrind-processed wafers W are stored in wafer shipping container 1 and shipped, support device 16 is first inserted and fixed with pairs of fitting ribs 20 fitted on stoppers 3 in container body 2 while a number of wafers W are put in alignment in cassette 6. These actions can be carried out simultaneously or may be done in the reverse order. Then, cassette 6 is placed in container body 2 along with support device 16 as shown in FIGS. 2, 6 and 7, so that multiple partitioning supporters 19 hold a number of wafers W while inhibiting their flexure. Then, lid element 10 with wafer presser 14 is hermetically fitted via gasket 13 over the open side of container body 2 so as to allow multiple support pieces 15 of wafer presser 14 to constrain movement of wafers W, thus making it possible to pertinently keep multiple wafers W in wafer shipping container 1 and transport it.

According to the above configuration, since multiple partitioning supporters 19 of support device 16 keep multiple wafers W by holding them in the area ranging from the wafer's center to the lower portion, the wafers W will not easily resonate due to vibrations during carriage or transportation. Further, the relatively simple configuration makes it possible to markedly effectively suppress the risk of wafers W coming in contact with each other, being damaged or broken, resulting from their flexure. Therefore, it is possible to prevent secondary damage, the adverse influence on the electronic circuitry of the other wafers W, which would occur due to broken pieces etc., if one wafer was broken. Since the existing wafer shipping container 1 can be used as is without the necessity of significant modifications, there is no need for dedicated supply equipment, transportation equipment and the like. Therefore, it is possible to expect, with a high degree of confidence, effective use of existing equipment.

Figure 9:
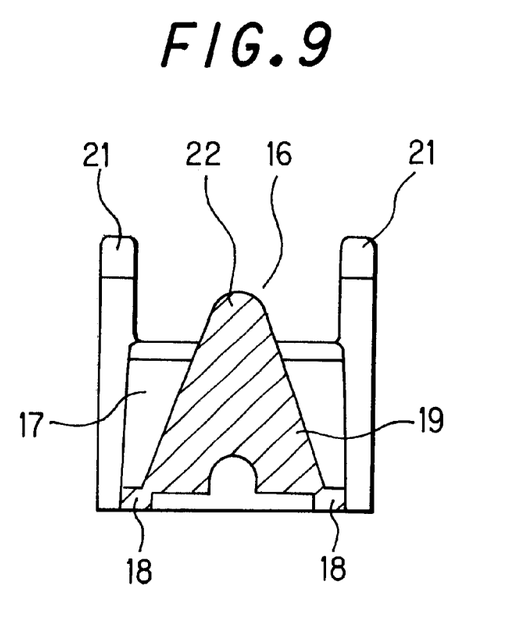
FIG. 9 is an illustrative sectional view showing a support device in the second embodiment of a support device for a wafer shipping container according to the present invention.
Figure 10:
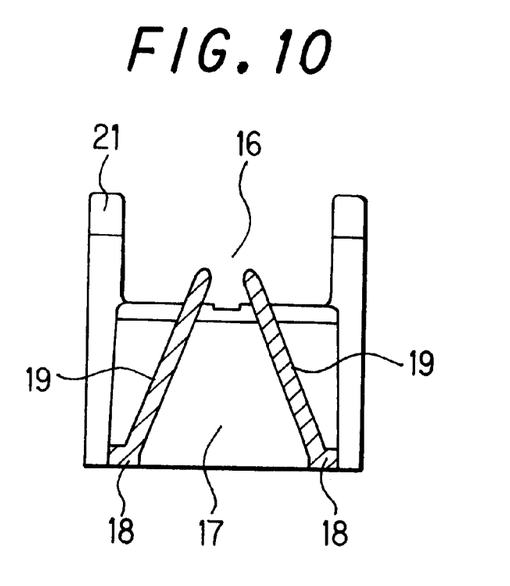
FIG. 10 is an illustrative sectional view showing a support device in the third embodiment of a support device for a wafer shipping container according to the present invention.

In the above embodiment, though stoppers 3 are formed so as to project inwards at least from the front and rear sides in container body 2, stoppers 3 may be formed so as to project inwards from the bottom as well as from the front and rear sides in container body 2. Further, the number and shape of fitting ribs 20 can be changed as appropriate. The number and shape of guide portions 21 can also be changed as appropriate. The description of the partitioning supporter 19 in the above embodiment to be formed in an approximately inverted U-shape, in an approximately inverted V-shape or in an arch-shape, should not limit the partitioning supporter. For example, as long as the same effect can be expected, partitioning supporters 19 may be formed of an approximately isosceles shaped plate with the top corner rounded (see FIG. 9) or may be provided by molding a pair of projecting bars inclined with their distal ends close to each other forming an inverted V-shape (see FIG. 10 ).

Figure 11:
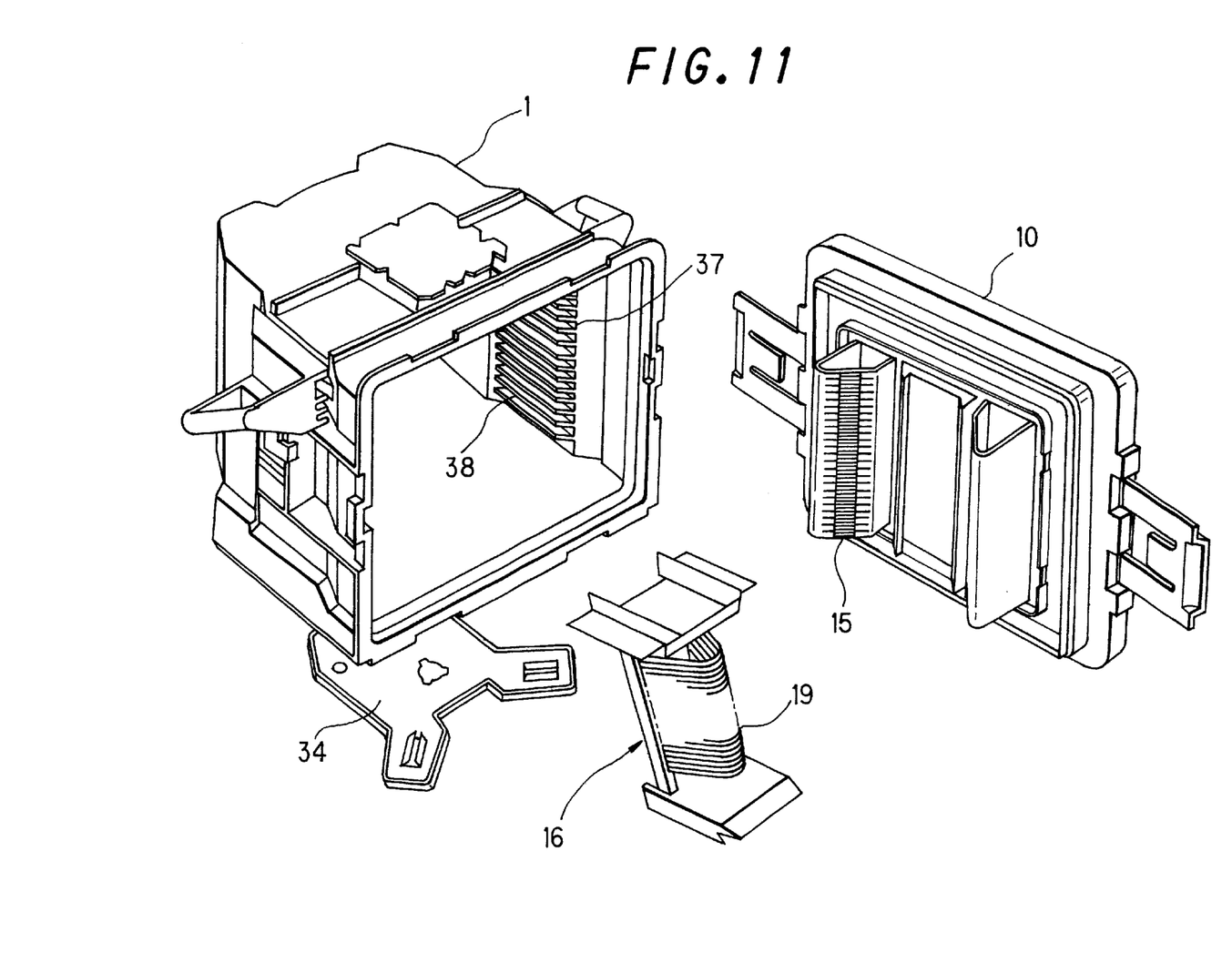
FIG. 11 is a perspective exploded view showing another embodiment of a wafer shipping container according to the present invention.

The support device 16 of the present invention can also be applied to a front-opening type box having an opening on the front side as shown FIG. 11. In this case, support device 16 is engaged against the interior side opposite the open side of container body 1 so that partitioning supporters 19 are positioned in parallel to wafer support pieces 15 provided on the inner wall of lid element 10 which will oppose container body 1. In this figure, holding slots 38 are arranged on interior walls 37 of container 1 to horizontally support a multiple number of wafers on their rims. This figure shows an example in which an approximately Y-shaped bottom plate 34 is attached to the bottom of container 1.

Other than the above, partitioning supporters 19 of an approximately M-shape, approximately Y-shape, semicircular, semi-ellipse, semi-oval or polygonal shape may be used as appropriate. The material of wafer shipping container 1 may be changed as long as it will suppress organic pollution and generation of particles. Further, the transparency of wafer shipping container 1 may be changed as appropriate.

EXAMPLE

An example of the support device of a wafer shipping container according to the present invention will be described along with a comparative example.

A wafer shipping container 1 of this embodiment and wafer shipping container 1 of a comparative example were used to perform a vibration test and drop and impact test, and then how the backgrind-processed wafers W were damaged was observed.

The Wafer Shipping Container of the Embodiment

Support device 16 shown in FIGS. 3 to 5 was installed in wafer shipping container 1 and twenty-five backgrind-processed 8" wafers W of about 300 μm thick were put therein.

Wafer Shipping Container of the Comparative Example

Twenty-five backgrind-processed 8" wafers W of about 300 μm thick were put in wafer shipping container 1 with support device 16 omitted.

Vibration Test

In a shaker system, the wafer shipping container 1 of the embodiment and the wafer shipping container 1 of the comparative example were placed separately on the vibration plate of this shaker system and fixed by a band of canvas, and were subjected to a 5 min. 30 Hz vibration, 5 min. 50 Hz vibration and 5 min. 70 Hz vibration. After completion of shaking, lid element 10 of each wafer shipping container 1 was removed slowly and the presence of damage of the backgrind-processed wafers W was visually observed. The result-is shown in Table 1.

TABLE 1

|  | Damaged number of wafers W |
| --- | --- |
| Embodiment | 0/25 |
| Comparative example | 6/25 |

Drop and Impact Test

The wafer shipping container 1 of the embodiment as well as the wafer shipping container 1 of the comparative example were externally packaged in a corrugated cardboard box with cushioning materials packed inside in contact with the top and bottom of the container. The thus packed wafer shipping container 1 was subjected to dropping. As to the dropping orientation, the wafer shipping container was positioned right-side up so that its bottom opposed the surface of concrete. For dropping, the package was dropped in free fall from a height of 40 cm from the surface of concrete so that the wafer shipping container 1 received an impact of about 50 G.

After dropping, lid element 10 of each wafer shipping container 1 was removed slowly and the presence of damage to the backgrind-processed wafers W was visually observed. The result is shown in Table 2.

TABLE 2

|  | Damaged number of wafers W |
| --- | --- |
| Embodiment | 0/25 |
| Comparative example | 14/25 |

As has been described, according to the present invention, it is possible to efficiently suppress or eliminate the risk of the wafers relatively easily resonating due to vibrations and being damaged and broken. Further it is also possible to prevent secondary damage, the adverse influence of a broken wafer causing damage to the other wafers, using existing equipment without the necessity of significant modifications.

What is claimed is:

1. A support device for a wafer shipping container, for constraining the flexure of a multiple number of backgrind-processed wafers when the wafers are stored in alignment in the wafer shipping container, wherein stoppers for the support device are formed on inner sides of the wafer shipping container, the support device comprising: a pair of opposing walls for positioning against an abutment side opposite to an open side of the wafer shipping container and fixed by the stoppers; a pair of connecting bars across the spacing between the pair of opposing walls; a multiple number of partitioning supporters arranged with a predetermined pitch in a longitudinal direction of the connecting bars, wherein adjoining partitioning supporters are configured to receive and hold wafers therebetween, wherein the partitioning supporters are projected equal to or greater than one third of a wafer diameter for receiving and holding the wafer between adjoining partitioning supporters.

2. The support device for a wafer shipping container according to Claim 1, wherein guide portions are formed at a distal part on the open side in the paired opposing walls of the support device.

3. The support device for a wafer shipping container according to claim 1, wherein the multiple partitioning supporters of the support device are configured so that the spacing between adjoining partitioning supporters becomes gradually greater as it goes upwards, forming a wafer introductory guide, which serves as a guide when the wafer is fitted in.

4. The support device for a wafer shipping container according to claim 1, wherein the multiple partitioning supporters are provided to span the spacing between, and perpendicularly to, the pair of connecting bars at regular intervals.

5. The support device for a wafer shipping container according to claim 1, wherein each of the partitioning supporters is formed of a plate element.

6. The support device for a wafer shipping container according to claim 1, wherein each of the partitioning supporters is formed of a pair of projecting bars inclined upwards with their top ends close to each other.

* * * * *